United States Patent [19]

Sugata et al.

[11] Patent Number: 4,870,388

[45] Date of Patent: Sep. 26, 1989

[54] HEAT-GENERATING RESISTOR AND HEAT-GENERATING RESISTANCE ELEMENT USING SAME

[75] Inventors: Masao Sugata, Yokohama, Japan; Tatsuo Masaki, deceased, late of Yokohama, Japan, by Yoshiko Masaki, legal successor; Hirokazu Komuro; Shinichi Hirasawa, both of Hiratsuka, Japan; Yasuhiro Yano, Kawasaki, Japan

[73] Assignee: Canon Kabushiki Kaisha, Tokyo, Japan

[21] Appl. No.: 22,533

[22] Filed: Mar. 4, 1987

Related U.S. Application Data

[63] Continuation of Ser. No. 841,270, Mar. 19, 1986, abandoned.

[30] Foreign Application Priority Data

Mar. 22, 1985 [JP] Japan .................................. 60-55654
Mar. 23, 1985 [JP] Japan .................................. 60-58843
Mar. 23, 1985 [JP] Japan .................................. 60-58845
Mar. 25, 1985 [JP] Japan .................................. 60-58527

[51] Int. Cl.$^4$ ........................................... H01C 1/012
[52] U.S. Cl. .................................... 338/308; 338/314; 219/543; 156/659.1; 252/518
[58] Field of Search ............... 338/306, 307, 308, 309, 338/314; 219/543, 544, 216; 156/659.1; 252/508, 518, 519, 511; 427/101, 102, 103, 244, 74, 39

[56] References Cited

U.S. PATENT DOCUMENTS

| | | | |
|---|---|---|---|
| 3,301,707 | 1/1967 | Loeb et al. | 219/308 X |
| 3,604,970 | 9/1971 | Culbertson et al. | 373/107 |
| 3,639,165 | 2/1972 | Rairden | 338/308 X |
| 3,645,783 | 2/1972 | Rupert et al. | 338/308 C |
| 4,036,786 | 7/1977 | Tiedeman | 252/511 |
| 4,060,660 | 11/1977 | Carlson et al. | 428/408 |
| 4,172,718 | 10/1979 | Menzel | 338/308 X |
| 4,296,309 | 10/1981 | Shinimi et al. | 219/216 |
| 4,361,638 | 11/1982 | Higashi et al. | 427/74 X |
| 4,400,410 | 8/1983 | Green et al. | 427/39 |
| 4,414,274 | 11/1983 | Hieber | 338/308 X |
| 4,436,797 | 3/1984 | Brady et al. | 204/192 C X |
| 4,522,663 | 6/1985 | Ovshinsky et al. | 427/74 X |
| 4,567,493 | 1/1986 | Ikeda et al. | 346/140 R |
| 4,568,626 | 2/1986 | Ogawa | 427/39 X |
| 4,585,704 | 4/1986 | Hirai | 252/508 X |
| 4,597,844 | 7/1986 | Hiraki | 204/192 C |
| 4,629,514 | 12/1986 | Suda | 148/1.5 |

FOREIGN PATENT DOCUMENTS

| | | |
|---|---|---|
| 0071082 | 2/1983 | European Pat. Off. . |
| 3411702 | 10/1984 | Fed. Rep. of Germany . |
| 3316182 | 11/1984 | Fed. Rep. of Germany . |
| 3041420 | 1/1985 | Fed. Rep. of Germany . |
| 49521 | 6/1981 | Japan . |
| 42473 | 3/1983 | Japan . |
| 42472 | 9/1983 | Japan . |
| 1410876 | 10/1975 | United Kingdom . |
| 1582231 | 1/1981 | United Kingdom . |
| 2083841 | 3/1982 | United Kingdom . |
| 2109012 | 5/1983 | United Kingdom . |

Primary Examiner—E. A. Goldberg
Assistant Examiner—M. M. Lateef
Attorney, Agent, or Firm—Fitzpatrick, Cella, Harper & Scinto

[57] ABSTRACT

A heat-generating resistor having a functional thin film comprising an amorphous material containing halogen atoms in a matrix of carbon atoms formed on a substrate.

35 Claims, 4 Drawing Sheets

HEAT-GENERATING RESISTOR AND HEAT-GENERATING RESISTANCE ELEMENT USING SAME

This application is a continuation of application Ser. No. 841,270 now abandoned filed Mar. 19, 1986.

BACKGROUND OF THE INVENTION

1. Field of the Invention

This invention relates to a heat-generating resistor and a heat-generating resistance element using the resistor, particularly to a thin film heat-generating resistor having a resistance thin film as a functional element on a substrate surface and a heat-generating resistance element using the resistor.

Such a resistor can be used suitably as an electricity-heat energy converting device in various electronic instruments and electrical instruments.

2. Related Background Art

In the prior art, the heat-generating resistors employed as relative small electricity-heat energy converting devices in electronic instruments or electrical instruments may include the thin film type, the thick film type and the semiconductor type. Among them, the thin film type heat-generating resistor can be smaller in power consumption as compared with other types and also relatively better in heat response, and therefore tends to be increasingly applied.

The performances demanded of such heat-generating resistors are good response of heat generation to a certain electrical signal, good thermal conductivity, good heat resistance to heat generation by themselves, various durabilities (e.g. durability against heat history) and the like.

In the conventional thin film type heat-generating resistors, the above performances cannot be satisfactorily achieved and further improvements of the characteristics are desired.

SUMMARY OF THE INVENTION

In view of the prior art as described above, an object of the present invention is to provide a thin film heat-generating resistor improved in heat response and a heat-generating resistance element having the resistor.

Another object of the present invention is to provide a thin film heat-generating resistor improved in thermal conductivity and a heat-generating resistance element having the resistor.

Still another object of the present invention is to provide a thin film heat-generating resistor improved in heat resistance and a heat-generating resistance element having the resistor.

Still another object of the present invention is to provide a thin film heat-generating resistor improved in durability and a heat-generating resistance element having the resistor.

It is also another object of the present invention to provide a thin film heat-generating resistor improved in chemical stability and thermal stability and a heat-generating resistance element having the resistor.

It is also still another object of the present invention to provide a thin film heat-generating resistor improved in controllability of resistance value and a heat-generating resistance element having the resistor.

Further object of the present invention is to provide a heat-generating resistor which has made various characteristics, such as heat accumulability, heat dissipatability, adhesion of the substrate to the functional thin film, easily realizable, and a heat-generating resistance element having the resistor.

According to the present invention, there is provided a thin film heat-generating resistor, having a functional thin film comprising an amorphous material containing halogen atoms in a matrix of carbon atoms formed on a substrate.

DESCRIPTION OF THE PREFERRED EMBODIMENTS

Figure 1:
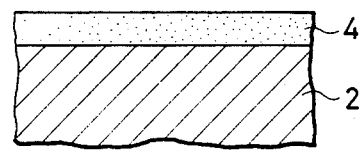
FIG. 1 and FIG. 2 are partial sectional views of the heat-generating resistor of the present invention.

Referring now to the drawings, the present invention is described in more detail.

FIG. 1 is a partial sectional view showing the construction of an embodiment of the heat-generating resistor of the present invention.

Figure 2:
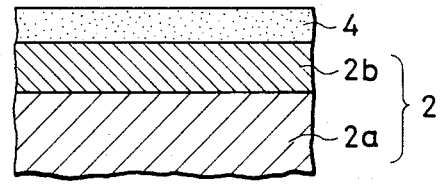

In this FIG. 2 is a substrate and 4 is a thin film for realizing functionality, namely resistance.

The material for the substrate 2 is not particularly limited in the present invention, but it is practically preferable to use a material which is good in adhesion to the functional thin film 4 to be formed on its surface, and also good in resistance to heat during formation of the functional thin film 4 and to the heat generated by the functional thin film 4 during usage. Also, the substrate 2 should preferably have an electrical resistance greater than the functional thin film 4 to be formed on its surface. Further, in the present invention, depending on the purpose of use of the resistor, a substrate 2 with small thermal conductivity or great thermal conductivity may be used.

Examples of the substrate 2 to be used in the present invention may include those comprising inorganic materials such as glass, ceramic, silicon, etc. and organic materials such as polyamide resin, polyimide resin, etc.

In the present invention, the functional thin film 4 comprises an amorphous material containing halogen atoms in a matrix of carbon atoms. As halogen atoms, F, Cl, Br, I and the like can be utilized, and these may be used either singly or in plural combination. As halogen atoms, particularly F and Cl are preferred, and above all F is preferred.

The content of halogen atoms in the functional thin film 4 may be suitably selected depending on the purpose of use of the resistor so that desired characteristics may be obtained, but it is preferably 0.0001 to 30 atomic %, more preferably 0.0005 to 20 atomic %, optimally 0.001 to 10 atomic %.

In the present invention, the above functional thin film 4 may comprise an amorphous material further containing a substance for controlling electroconductivity therein. Also, in this case, as halogen atoms, F, Cl, Br, I and the like can be utilized, and these may be used either singly or in plural combination. As halogen atoms, particularly F and Cl are preferred, and above all F is preferred. On the other hand, for the substance for controlling electroconductivity, there may be utilized the so called impurities in the field of semiconductors, namely p-type impurities giving p-type conduction characteristics to carbon and n-type impurities giving n-type conduction characteristics to carbon. As the p-type impurities, the atoms belonging to group III of the periodic table such as B, Al, Ga, In and Tl may be included, particularly preferably B and Ga. As the n-type impurities, the atoms belonging to group V of the periodic table such as P, As, Sb and Bi may be included, particularly P and As. These can be used either singly or in plural combination.

The content of halogen atoms in the functional thin film 4 containing a substance for controlling electroconductivity may be selected, suitably depending on the purpose of use, so that desired characteristics may be obtained, but it is preferably 0.0001 to 30 atomic %, more preferably 0.0005 to 20 atomic %, optimally 0.001 to 10 atomic %, similarly as in the above described case where a substance for controlling electroconductivity is not contained.

On the other hand, the content of the substance for controlling electroconductivity in the functional thin film 4 may be selected suitably so as to obtain desirable characteristics depending on the purpose of use of the resistor, but it may be preferably 0.01 to 50000 atomic ppm, more preferably 0.5 to 10000 atomic ppm, optimally 1 to 5000 atomic ppm.

The functional thin film comprising an amorphous material containing halogen atoms in a matrix of carbon atoms (hereinafter sometimes abbreviated as "a-C:X") in the heat-generating resistor of the present invention can be formed according to a plasma CVD method such as the glow discharge method or a vacuum deposition method such as the sputtering method.

For example, for formation of the thin film 4 comprising a-C:X according to the glow discharge method, the basic process may comprise arranging the substrate 2 in a deposition chamber under reduced pressure, introducing a starting gas for C supply capable of supplying carbon atoms (C) and a starting gas for X supply capable of supplying halogen atoms (X) into the deposition chamber and exciting glow discharge by use of high frequency or microwave in the deposition chamber thereby to form a layer comprising a-C:X on the surface of the substrate 2.

On the other hand, for formation of the thin film comprising a-C:X according to the sputtering method, the basic process may comprise arranging the substrate 2 in a deposition chamber under reduced pressure and introducing a starting gas for X supply into the deposition chamber in carrying out sputtering of a target constituted of C in an atmosphere of an inert gas such as Ar, He or the like, or a gas mixture based on these gases in the deposition chamber.

Also in the case of the functional thin film 4 comprising an amorphous material containing halogen atoms and a substance for controlling electroconductivity in a matrix of carbon atoms (hereinafter sometimes abbreviated as "a-C:X(p,n)"; here, X represents a halogen atom and (p,n) represents a substance for controlling electroconductivity) in the heat-generating resistor of the present invention, it can be formed according to a plasma CVD method such as the glow discharge method or a vacuum deposition method such as the sputtering method.

For example, for formation of the thin film 4 comprising a-C:X(p,n) according to the glow discharge method, the basic process may comprise arranging the substrate 2 in a deposition chamber under reduced pressure, introducing a starting gas for C supply capable of supplying carbon atoms (C), a starting gas for X supply capable of supplying halogen atoms (X) and a starting gas for supplying a substance for controlling electroconductivity into the deposition chamber and exciting glow discharge by use of high frequency or microwave in the deposition chamber thereby to form a layer comprising a-C:X(p,n) on the surface of the substrate 2.

On the other hand, for formation of the thin film 4 comprising a-C:X(p,n) according to the sputtering method, the basic process may comprise arranging the substrate 2 in a deposition chamber under reduced pressure and introducing a starting gas for X supply and a starting gas for supplying a substance for controlling electroconductivity into the deposition chamber in carrying out sputtering of a target constituted of C in an atmosphere of an inert gas such as Ar, He or the like, or a gas mixture based on these gases in the deposition chamber.

In the above processes, as the starting gas for C supply, the starting gas for X supply and the starting gas for supplying a substance for controlling electroconductivity, substances gaseous under normal temperature and normal pressure or otherwise those gasifiable under reduced pressure can be used.

The starting material for C supply may include, for example, saturated hydrocarbons having 1 to 5 carbon atoms, ethylenic hydrocarbons having 2 to 5 carbon atoms, acetylenic hydrocarbons having 2 to 4 carbon atoms, specifically saturated hydrocarbons such as methane ($CH_4$), ethane ($C_2H_6$), propane ($C_3H_8$), n-butane (n-$C_4H_{10}$), pentane ($C_5H_{12}$); ethylenic hydrocarbons such as ethylene ($C_2H_4$), propylene ($C_3H_6$), butene-1 ($C_4H_8$), butene-2 ($C_4H_8$), isobutylene ($C_4H_8$), pentene ($C_5H_{10}$); acetylenic hydrocarbons such as acetylene ($C_2H_2$), methylacetylene ($C_3H_4$), butyne ($C_4H_6$); aromatic hydrocarbons such as benzene ($C_6H_6$) or the like.

The starting material for X supply may include, for example, halogens, halides, interhalogen compounds, halo-substituted hydrocarbon derivatives, specifically halogens such as $F_2$, $Cl_2$, $Br_2$, $I_2$; halides such as HF, HCl, HBr, HI; interhalogen compounds such as BrF, ClF, $ClF_3$, $BrF_5$, $BrF_3$, $IF_3$, $IF_7$, ICl, IBr; halo-substituted hydrocarbon derivatives such as $CF_4$, $CHF_3$, $CH_2F_2$, $CH_3F$, $CCl_4$, $CHCl_3$, $CH_2Cl_2$, $CH_3Cl$, $CBr_4$, $CHBr_3$, $CH_2Br_2$, $CH_3Br$, $CI_4$, $CHI_3$, $CH_2I_2$, $CH_3I$; and the like.

The starting material for supplying a substance for controlling electroconductivity may include the exemplary compounds shown below.

Examples of the starting material for supplying the group III atoms are boron hydrides such as $B_2H_6$, $B_4H_{10}$, $B_5H_9$, $B_5H_{11}$, $B_6H_{10}$, $B_6H_{12}$, $B_6H_{14}$ or the like, and boron halides such as $BF_3$, $BCl_3$, $BBr_3$ or the like, for supplying boron atoms, and further $AlCl_3$, $GaCl_3$, $Ga(CH_3)_3$, $InCl_3$, $TlCl_3$ and others for supplying other atoms.

Examples of the starting material for supplying the group V atoms are phosphorus hydrides such as $PH_3$, $P_2H_4$ or the like and phosphorus halides such as $PH_4I$, $PF_3$, $PF_5$, $PCl_3$, $PCl_5$, $PBr_3$, $PBr_5$, $PI_3$ or the like, and further $AsH_3$, $AsF_3$, $AsCl_3$, $AsBr_3$, $AsF_5$, $SbH_3$, $SbF_3$, SbF$_5$, SbCl$_3$, SbCl$_5$, BiH$_3$, BiCl$_3$, BiBr$_3$ and others for supplying other atoms.

These starting materials may be used either singly or in plural combination.

In the process for forming a thin film as described above, for controlling the amount of halogen atoms contained in the thin film 4 to be formed and the characteristics of the thin film 4, the substrate temperature, the amounts of the starting gases supplied, the discharging power and the pressure in the deposition chamber are adequately set.

The substrate temperature may preferably be 20° to 1500° C., more preferably 30° to 1200° C., optimally 50° to 1100° C.

The amounts of the starting gases supplied are determined suitably depending on the desired thin film performances and the aimed film forming speed.

The discharging power may preferably be 0.001 to 20 W/cm$^2$, more preferably 0.01 to 15 W/cm$^2$, optimally 0.05 to 10 W/cm$^2$.

The pressure in the deposition chamber may preferably be $10^{-4}$ to 10 Torr, optimally $10^{-2}$ to 50 Torr.

The thin film in the heat-generating resistor obtained by use of the process for forming thin film as described above has characteristics approximate to diamond. That is, for example, it has properties of a Vickers hardness of 1800 to 5000, a thermal conductivity of 0.3 to 2 cal/cm-.sec.deg, and a resistivity of $10^{-3}$ to $10^6$ ohm.cm. Also, since it contains halogen atoms, a resistor very excellent also in chemical stability and thermal stability can be obtained.

Also, in the process for forming a thin film as described above, for controlling the amounts of halogen atoms and the substance for controlling electroconductivity and the characteristics of the thin film 4 formed containing a substance for controlling electroconductivity, the substrate temperature, the amounts of the starting gases supplied, the discharging power and the pressure in the deposition chamber are adequately set.

The substrate temperature may preferably be 20° to 1500° C., more preferably 30° to 1200° C., optimally 50° to 1100° C.

The amounts of the starting gases supplied are determined suitably depending on the desired thin film performances and the aimed film forming speed.

The discharging power may preferably be 0.001 to 20 W/cm$^2$, more preferably 0.01 to 15 W/cm$^2$, optimally 0.05 to 10 W/cm$^2$.

The pressure in the deposition chamber may preferably be $10^{-4}$ to 10 Torr, optimally $10^{-2}$ to 5 Torr.

The thin film in the heat-generating resistor obtained by use of the process for forming thin film as described above has characteristics approximate to diamond. That is, for example, it has properties of a Vickers hardness of 1800 to 5000, a thermal conductivity of 0.3 to 2 cal/cm-.sec.deg, and a resistivity of $10^{-3}$ to $10^6$ ohm.cm. Also, since it contains halogen atoms and a substance for controlling electroconductivity, it is very excellent in controllability of resistance value.

The resistor of the present invention can also be provided with a layer (not shown) having suitable functions such as protection or other functions on its functional thin film 4, as a matter of course.

Having described above with reference to a single substrate 2, the substrate 2 may also be a composite material. An example of such an embodiment is shown in FIG. 2. That is, the substrate 2 comprises a composite material of a base portion 2a and a surface layer 2b, and the substrate material described with reference to the above FIG. 1, for example, can be used as the base portion 2a, while a material having good adhesiveness to the functional thin film 4 to be formed thereon can be used as the surface layer 2b. The surface layer 2b may be constituted of, for example, an amorphous material having a matrix of carbon atoms or an oxide conventionally known in the art. Such a surface layer 2b can be obtained by use of a suitable starting material by depositing on the base portion 2a according to the process similar to the above-described thin film forming process. Also, the surface layer 2b may be a glaze layer of a conventional glassy material.

Next, a schematic explanation of the process for producing the heat-generating resistor of the present invention is given below.

Figure 3:
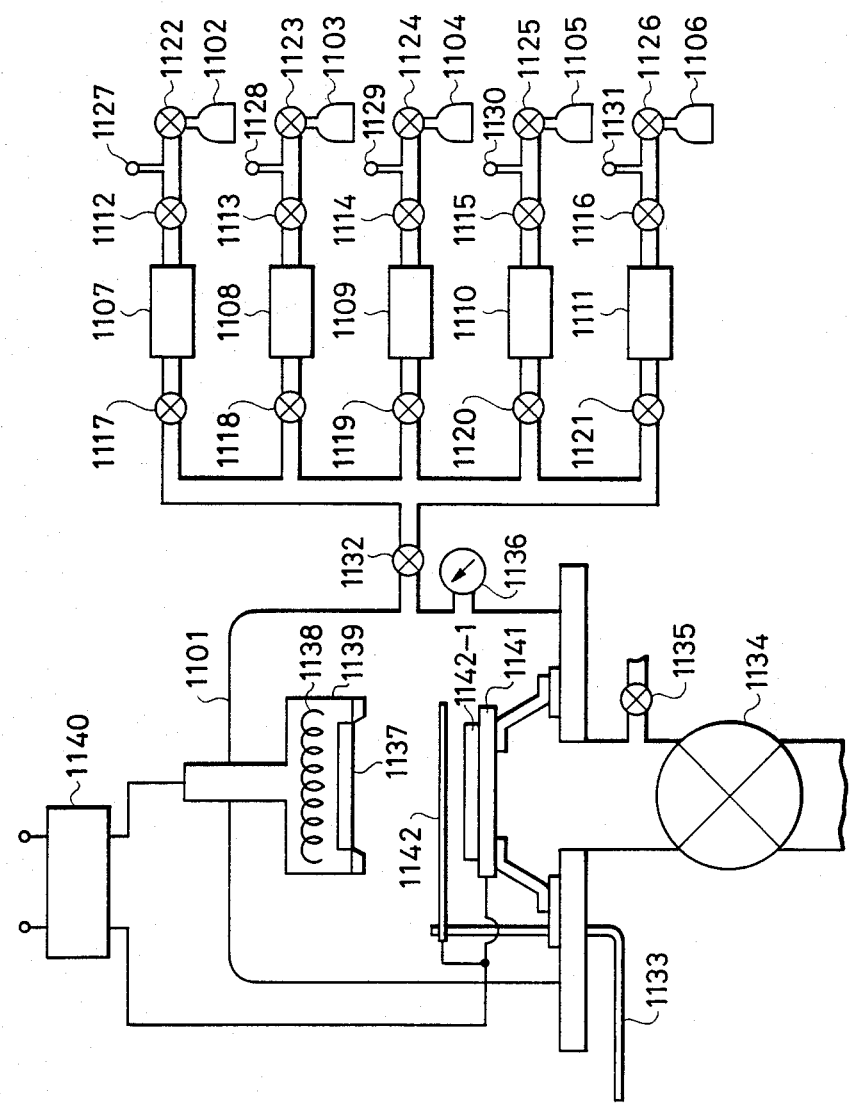
FIG. 3 is an illustration of the device to be used for preparation of the heat-generating resistor of the present invention.
Figure 4:
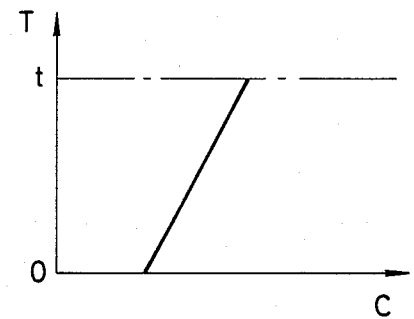
FIG. 4 to FIG. 9 are graphs showing distribution of the content of halogen atoms and/or a substance for controlling electroconductivity in the functional thin film.
Figure 5:
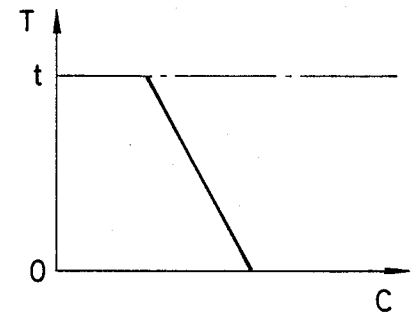
Figure 6:
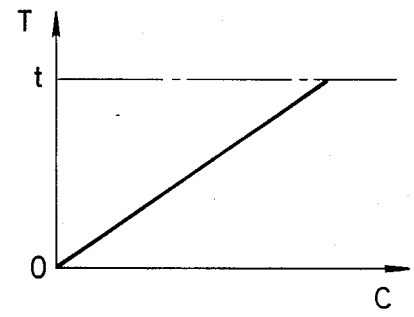
Figure 7:
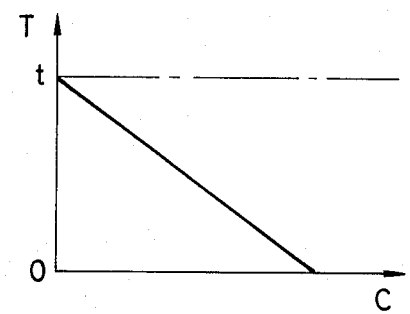
Figure 8:
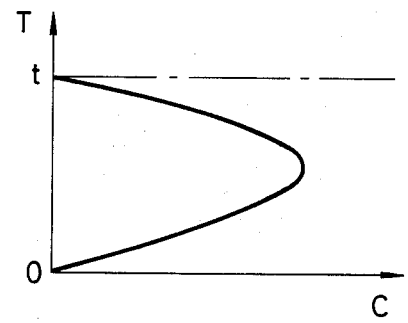
Figure 9:
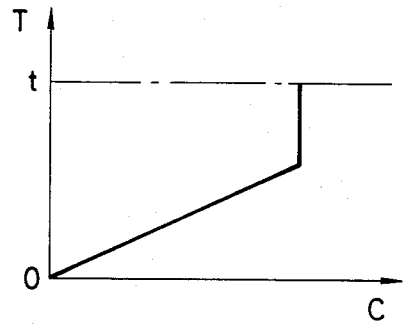

FIG. 3 is an illustration showing an example of the device to be used during formation of the functional thin film on the substrate surface. 1101 is a deposition chamber, 1102 to 1106 are gas bombs, 1107 to 1111 are mass flow controllers, 1112 to 1116 are inflow valves, 1117 to 1121 are outflow valves, 1122 to 1126 are valves for gas bombs, 1127 to 1131 are outlet pressure gauges, 1132 is an auxiliary valve, 1133 is a lever, 1134 is a main valve, 1135 is a leak valve, 1136 is a vacuum gauge, 1137 is a substrate material of the resistor to be prepared, 1138 is a heater, 1139 is a substrate supporting member, 1140 is a high voltage power source, 1141 is an electrode, and 1142 is a shutter. 1142-1 is a target which is mounted on the electrode 1141 in carrying out the sputtering method.

For example, 1102 is hermetically filled with CF$_4$ gas (purity: 99.9% or higher) diluted with Ar gas, and 1103 hermetically filled with C$_2$F$_6$ gas (purity: 99.9% or higher) diluted with Ar gas. Prior to inflow of the gases in these bombs into the deposition chamber, while confirming that the valves 1122 to 1126 for the respective bombs 1102 to 1106 and the leak valve 1135 are closed, and also confirming that the inflow valves 1112 to 1116, the outflow valves 1117 to 1121 and the auxiliary valve 1132 are opened, first the main valve 1134 is opened to evacuate internally the deposition chamber and the gas pipelines. Next, when the reading on the vacuum gauge becomes about $1.5 \times 10^{-6}$ Torr, the auxiliary valve 1132, the inflow valves 1112 to 1116 and the outflow valves 1117 to 1121 are closed. Then, the valve of the gas pipeline connected to the bomb of the gas to be introduced into the deposition chamber 1101 is opened to introduce the desired gas into the deposition chamber 1101.

Next, an example of the procedure when preparing the resistor of the present invention according to the glow discharge method by use of the above device is described. By opening the valve 1122, CF$_4$/Ar gas is permitted to flow out from the gas bomb 1102, and then with adjustment of the outlet pressure gauge 1127 to 1 Kg/cm$^2$, to flow into the mass flow controller 1107 by opening gradually the inflow valve 1112. Subsequently, by opening gradually the inflow valve 1117 and the auxiliary valve 1132, CF$_4$/Ar gas is introduced into the deposition chamber 1101. During this operation, the mass flow controller 1107 is adjusted so that the flow rate of CF$_4$/Ar gas may become a desired value, and also the opening of the main valve 1134 is adjusted while watching the reading on the vacuum gauge 1136 so that the pressure in the deposition chamber may become a desired value. And, after the substrate 1137 supported by the supporting member 1139 in the deposition chamber 1101 is heated by the heater 1138 to a desired temperature, the shutter 1142 is opened and glow discharge is generated in the deposition chamber 1101. When the content of halogen atoms in the heat-generating resistor is distributed nonuniformly, the operation of changing the opening of the outflow valve 1117 may be performed manually or by means of an externally driven motor, etc. to change the flow rate of $CF_4$/Ar gas with lapse of time following the change rate curve previously designed, thereby changing the content of F atoms in the functional thin film 4 in the film thickness direction.

Next, an example of the procedure when preparing the resistor of the present invention according to the sputtering method by use of the above device is described. On the electrode 1141 to which high voltage is to be applied from the high voltage power source 1140, a high purity graphite 1142-1 is previously disposed as the target. Similarly as in the case of the glow discharge method, $CF_4$/Ar gas is introduced from the gas bomb 1102 into the deposition chamber 1101 at a desired flow rate. By actuating the high voltage power source 1140 with opening of the shutter 1142, the target 1142-1 is subjected to sputtering. The operations of heating the substrate 1137 to a desired temperature by the heater 1138 and adjusting internally the deposition chamber 1101 to a desired pressure by controlling the opening of the main valve 1134 are the same as in the case of the glow discharging method.

In order to distribute halogen atoms nonuniformly in the heat-generating resistor in the sputtering method, similarly as in the case of the above glow discharge method, the flow rate of $CF_4$/Ar gas is changed with lapse of time following the change rate curve previously designed, whereby the content of F atoms in the functional thin film 4 can be changed in the film thickness direction.

Next, a schematic explanation of the process for producing the heat-generating resistor of the present invention containing a substance for controlling electroconductivity is given.

1102 is hermetically filled with $CF_4$ gas (purity: 99.9% or higher) diluted with Ar gas, 1103 hermetically filled with $BF_3$ gas (purity: 99.9% or higher) diluted with Ar gas, and 1104 hermetically filled with $PF_5$ gas (purity: 99.9% or higher) diluted with Ar gas. Prior to inflow of the gases in these bombs into the deposition chamber 1101, while confirming that the valves 1122 to 1126 for the respective bombs 1102 to 1106 and the leak valve 1135 are closed, and also confirming that the inflow valves 1112 to 1116, the outflow valves 1117 to 1121 and the auxiliary valve 1132 are opened, first the main valve 1134 is opened to evacuate internally the deposition chamber and the gas pipelines. Next, when the reading on the vacuum gauge becomes about $1.5 \times 10^{-6}$ Torr, the auxiliary valve 1132, the inflow valves 1112 to 1116 and the outflow valves 1117 to 1121 are closed. Then, the valve of the gas pipeline connected to the bomb of the gas to be introduced into the deposition chamber 1101 is opened to introduce the desired gas into the deposition chamber 1101.

Next, an example of the procedure when preparing the resistor of the present invention according to the glow discharge method by use of the above device is described. By opening the valve 1122, $CF_4$/Ar gas is permitted to flow out from the gas bomb 1102 and $BF_3$/Ar gas from the gas bomb 1103, and then with adjustment of the outlet pressure gauges 1127 and 1128 to 1 Kg/cm² to flow into the mass flow controllers 1107 and 1108 by opening gradually the inflow valves 1112 and 1113. Subsequently, by opening gradually the inflow valves 1117, 1118 and the auxiliary valve 1132, $CF_4$/Ar gas and $BF_3$/Ar gas are introduced into the deposition chamber 1101. During this operation, the mass flow controllers 1107 and 1108 are adjusted so that the ratio of the flow rate of $CF_4$/Ar gas to the flow rate of $BF_3$/Ar gas may become a desired value, and also the opening of the main valve 1134 is adjusted while watching the reading on the vacuum gauge 1136 so that the pressure in the deposition chamber may become a desired value. And, after the substrate 1137 supported by the supporting member 1139 in the deposition chamber is heated by the heater 1138 to a desired temperature, the shutter 1142 is opened and glow discharge is generated in the deposition chamber 1101. When halogen atoms and/or a substance for controlling electroconductivity are distributed nonuniformly in the heat-generating resistor, the operation of changing the openings of the outflow valves 1117 and 1118 may be performed manually or by means of an externally driven motor, etc. to change the flow rate of $CF_4$/Ar gas and/or the flow rate of $BF_3$/Ar gas with lapse of time following the change rate curve previously designed, thereby changing the content of F atoms and/or the content of the substance for controlling electroconductivity in the functional thin film 4 in the film thickness direction.

Next, an example of the procedure when preparing the resistor of the present invention according to the sputtering method by use of the above device is described. On the electrode 1141 to which high voltage is to be applied from the high voltage power source 1140, a high purity graphite 1142-1 is previously disposed as the target. Similarly as in the case of the glow discharge method, $CF_4$/Ar gas from the gas bomb 1102 and $BF_3$/Ar gas from the gas bomb 1103 are introduced into the deposition chamber 101 at respective desired flow rates. By actuating the high voltage power source 1140 with opening of the shutter 1142, the target 1142-1 is subjected to sputtering. The operations of heating the substrate 1137 to a desired temperature by the heater 1138 and adjusting internally the deposition chamber 1101 to a desired pressure by controlling the opening of the main valve 1134 are the same as in the case of the glow discharge method.

When halogen atoms and/or the substance for controlling electroconductivity are distributed nonuniformly in the heat-generating resistor in the sputtering method, the operation of changing the openings of the outflow valves 1117 and 1118 may be performed similarly as in the case of the above glow discharge method to change the flow rate of $CF_4$/Ar gas and/or the flow rate of $BF_3$/Ar gas with lapse of time following the change rate curves previously designed, whereby the content of F atoms and/or the content of the substance for controlling electroconductivity in the functional thin film 4 can be changed in the film thickness direction.

When the distribution of halogen atoms in the functional thin film 4 is nonuniform in the film thickness direction, the content of halogen atoms in the functional thin film 4 may be changed in a manner such that it is gradually increased from the substrate 2 side toward the surface side or, on the contrary, the content is reduced in the above direction. Further, the content of halogen atoms in the functional thin film 4 may be changed in a manner such that it may have maximum or minimum value. The change in content of halogen atoms in the functional thin film 4 in the film thickness direction may be selected optimally so that desired characteristics may be obtained depending on the use of the heat-generating resistor.

FIGS. 4 through 9 show examples of the changes in contents of halogen atoms in the functional thin film 4 with respect to the film thickness direction. In these Figures, the ordinate represents the distance T from the interface with the substrate 2 in the film thickness direction, and t represents the film thickness of the functional thin film 4. On the other hand, the abscissa represents the content C of halogen atoms. In respective Figures, the scales on the ordinate T and the abscissa C are not necessarily uniform, but they are changed so as to exhibit the characteristics of the respective Figures. Accordingly, in practical application, various distributions based on the difference in specific numerical values are used for respective Figures.

Also, in the case of containing a substance for controlling electroconductivity, it may be selected similarly as the above halogen atoms so that desired characteristics may be obtained. Also in this case, the changes in content as shown in FIGS. 4 to 9 can be taken.

The change in content of halogen atoms is not required to coincide with that of the substance for controlling electroconductivity, but respective changes may be determined depending on the desired characteristics.

As described above, by use of an amorphous material containing halogen atoms in a matrix of carbon atoms as the functional thin film, there are provided a heat-generating resistor which is markedly good in heat response, heat conductivity, heat resistance and/or durability, and further markedly good in chemical stability and thermal stability, and a heat-generating resistance element having the resistor.

Also, by use of an amorphous material containing halogen atoms and a substance for controlling electroconductivity in a matrix of carbon atoms, there are provided a heat-generating resistor which s markedly good in heat response, heat conductivity, heat resistance and/or durability, and further markedly good in controllability of resistance value and a heat-generating resistance element having the resistor.

Further, by making the halogen atoms and/or the substance for controlling electroconductivity nonuniformly distributed in the film thickness direction of the functional thin film, various characteristics such as heat accumulability, heat dissipatability, adhesiveness of the substrate with the functional thin film, etc. can be realized with ease.

In the following, specific examples of the heat-generating resistor of the present invention are shown.

EXAMPLE 1

By use of an alumina ceramic plate as a substrate, a heat-generating resistance layer which is a functional thin film was formed on the surface of the substrate. Deposition of the heat-generating resistance layer was carried out according to the glow discharge method by use of the device shown in FIG. 3. As the starting gas, $CF_4/Ar=0.5$ (volume ratio) was employed. The conditions during deposition were as shown in Table 1. During deposition, the degrees of opening of the respective valves and other conditions were maintained constant, and the heat-generating resistance layer with a thickness shown in Table 1 was formed.

After an aluminum layer was formed on the resistance layer according to the electron beam vapor deposition method, the aluminum layer was etched by photolithographic technique to a desired shape to form plural pairs of electrodes.

Figure 10:
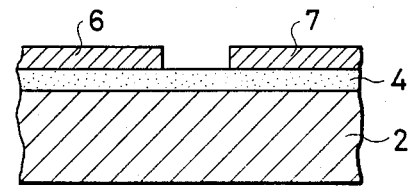
FIG. 10 is a partial sectional view of the heat-generating resistance element prepared in Examples of the present invention.

Subsequently, the resistance layer at a predetermined portion was removed by use of a HF type etchant according to photolithographic technique. In this Example, the size of the resistance layer lying between the above electrode pair was made $100 \mu m \times 100 \mu m$. In this Example, a plural number of heat-generating resistance devices were prepared on the substrate so that the heat-generating elements formed between the electrode pairs may be arranged at a pitch of 8 pieces/mm. FIG. 10 shows a partial sectional view of the thus prepared heat-generating resistance element. In the Figure, 2 is a substrate, 4 is a heat-generating resistance layer, and 6, 7 are a pair of electrodes.

Electric resistance of each heat-generating resistance element thus obtained was measured to be 80 ohm.

Also, durability of each heat-generating resistance element was measured by inputting electrical pulse signals into the heat-generating resistance element obtained according to this Example. For the electrical pulse signal, its duty was made 50%, applied voltage 20 V and the driving frequencies 0.5 KHz, 1.0 KHz and 2.0 KHz.

As a result, the heat-generating resistance elements were not destroyed even when the number of electrical pulse signal inputting reached $1 \times 10^{10}$ times in every case of driving at different driving frequencies, and their resistance values were substantially unchanged.

EXAMPLE 2

A heat-generating resistance layer with the same thickness was deposited in the same manner as in Example 1 except for changing the starting gas to $C_2F_6/Ar=0.2$ (volume ratio) and the discharging power to 2 W/cm$^2$.

Next, when heat-generating resistance elements were prepared and electrical pulse signal was inputted therein in the same manner as in Example 1, the heat-generating resistance elements were not destroyed even when the number of electrical pulse signal inputting reached $1 \times 10^{10}$ times. Also, no change in resistance value was recognized.

EXAMPLE 3

Heat-generating resistance elements were prepared by depositing a heat-generating resistance layer in the same manner as in Example 1 except for changing the substrate to #7059 glass (produced by Corning Glass Works).

When the thus obtained heat-generating resistance elements were driven in the same manner as in Example 1, it was confirmed that they had satisfactory durability similarly as in Example 1.

EXAMPLE 4

Heat-generating resistance elements were prepared by depositing a heat-generating resistance layer in the same manner as in Example 2 except for changing the substrate to #7059 glass (produced by Corning Glass Works).

When the thus obtained heat-generating resistance elements were driven in the same manner as in Example 2, it was confirmed that they had satisfactory durability similarly as in Example 2.

EXAMPLE 5

By use of an alumina ceramic plate as a substrate, a heat-generating resistance layer which is a functional thin film was formed on the surface of the substrate. Deposition of the heat-generating resistance layer was carried out according to the sputtering method by use of the device shown in FIG. 3. As the target for sputtering, a graphite having a purity of 99.9% or higher was employed, and as the starting gas, $CF_4/Ar=0.5$ (volume ratio) was employed. The conditions during deposition are as shown in Table 1. The gas pressure in the deposition chamber during sputtering was $4\times10^2$ Torr. During deposition, the degrees of opening of the respective valves and other conditions were maintained constant, and the heat-generating resistance layer with a thickness shown in Table 1 was formed.

By use of the thus prepared resistance layer, heat-generating resistance elements were prepared and further electrical pulse signal was inputted therein in the same manner as in Example 1, and they were confirmed to be excellent in durability similarly as in Example 1.

EXAMPLE 7

A heat-generating resistance layer with the same thickness was deposited in the same manner as in Example 6 except for changing the starting gas to $C_2F_6/Ar=0.2$ (volume ratio) and the discharging power to 2 $W/cm^2$.

Next, when heat-generating resistance elements were prepared and electrical pulse signal was inputted therein in the same manner as in Example 6, the heat-generating resistance elements were not destroyed even when the number of electrical pulse signal inputting reached $1\times10^{10}$ times. Also, no change in resistance value was recognized.

EXAMPLE 8

Heat-generating resistance elements were prepared by depositing a heat-generating resistance layer in the same manner as in Example 6 except for changing the substrate to #7059 glass (produced by Corning Glass Works) and changing the flow rate of $CF_4/Ar$ gas.

When the thus obtained heat-generating resistance elements were driven in the same manner as in Example 6, it was confirmed that they had satisfactory durability similarly as in Example 6.

TABLE 1

| Example No. | Starting material | Gas flow rate (SCCM) | Discharging power ($W/cm^2$) | Substrate temperature (°C.) | Film thickness (Å) |
| --- | --- | --- | --- | --- | --- |
| 1 | $CF_4/Ar = 0.5$ | 50 | 1 | 350 | 3000 |
| 2 | $C_2F_6/Ar = 0.2$ | 50 | 2 | 350 | 3000 |
| 3 | $CF_4/Ar = 0.5$ | 50 | 1 | 350 | 3000 |
| 4 | $C_2F_6/Ar = 0.2$ | 50 | 2 | 350 | 3000 |
| 5 | $CF_4/Ar = 0.5$ | 20 | 5.5 | 350 | 3000 |

EXAMPLE 6

Heat-generating resistance elements were prepared in the same manner as in Example 1 except for changing the flow rate of $CF_4/Ar$ gas by changing continuously the degree of opening of the valve during deposition of the heat-generating resistance layer. The conditions during deposition and the thickness of the heat-generating resistance layer are shown in Table 2.

Electric resistance of each heat-generating element thus obtained was measured to be 85 ohm.

Also, durability of the heat-generating resistance elements were measured by inputting electrical pulse signals into the heat-generating resistance elements obtained according to this Example. For the electrical pulse signal, its duty was made 50%, applied voltage 20 V and the driving frequencies 0.5 KHz, 1.0 KHz and 2.0 KHz.

As a result, the heat-generating resistance elements were not destroyed even when the number of electrical pulse signal inputting reached $1\times10^{10}$ times in every case of driving at different driving frequencies, and their resistance values were substantially unchanged.

EXAMPLE 9

Heat-generating resistance elements were prepared by depositing a heat-generating resistance layer in the same manner as in Example 7 except for changing the substrate to #7059 glass and changing the flow rate of $C_2F_6/Ar$ gas.

When the thus obtained heat-generating resistance elements were driven in the same manner as in Example 7, it was confirmed that they had satisfactory durability similarly as in Example 7.

EXAMPLE 10

Heat-generating resistance elements were prepared in the same manner as in Example 5 except for changing the flow rate of $CF_4/Ar$ gas by changing continuously the degree of opening of the valve during deposition of the heat-generating resistance layer. The conditions during deposition and the layer thickness of the heat-generating resistance layer prepared are shown in Table 2.

By use of the thus prepared resistance layer, heat-generating resistance element were prepared and further electrical pulse signal was inputted therein in the same manner as in Example 6, and they were confirmed to be excellent in durability similarly as in Example 6.

TABLE 2

| Example No. | Starting Material | Gas flow rate (SCCM) | Discharging power (W/cm$^2$) | Substrate temperature (°C.) | Film thickness (Å) |
|---|---|---|---|---|---|
| 6 | CF$_4$/Ar = 0.5 | 50→20 | 1 | 350 | 3000 |
| 7 | C$_2$F$_6$/Ar = 0.2 | 50→20 | 2 | 350 | 3000 |
| 8 | CF$_4$/Ar = 0.5 | 20→50 | 1 | 350 | 3000 |
| 9 | C$_2$F$_6$/Ar = 0.2 | 20→50 | 2 | 350 | 3000 |
| 10 | CF$_4$/Ar = 0.5 | 20→10 | 5.5 | 350 | 3000 |

EXAMPLE 11

By use of an alumina ceramic plate as a substrate, a heat-generating resistance layer which is a functional thin film was formed on the surface of the substrate. Deposition of the heat-generating resistance layer was carried out according to the glow discharge method by use of the device shown in FIG. 3. As the starting gas, CF$_4$/Ar=0.5 (volume ratio) and BF$_3$/Ar=1000 ppm (volume ratio) were employed. The conditions during deposition were as shown in Table 3. During deposition, the degrees of opening of the respective valves and other conditions were maintained constant, and the heat-generating resistance layer with a thickness shown in Table 3 was formed.

After an aluminum layer was formed on the resistance layer according to the electron beam vapor deposition method, the aluminum layer was etched by photolithographic technique to a desired shape to form plural pairs of electrodes.

Subsequently, the resistance layer at a predetermined portion was removed by use of a HF type etchant according to photolithographic technique. In this Example, the size of the resistance layer lying between the above electrode pair was made 100 μm × 100 μm. In this Example, a plural number of heat-generating resistance elements were prepared on the substrate so that the heat-generating elements formed between the electrode pairs may be arranged at a pitch of 8 pieces/mm. FIG. 10 shows a partial sectional view of the thus prepared heat-generating resistance element. In the Figure, 2 is a substrate, 4 is a heat-generating resistance layer, and 6, 7 are a pair of electrodes.

Electric resistance of each heat-generating element thus obtained was measured to be 75 ohm.

Also, durability of the heat-generating resistance elements were measured by inputting electrical pulse signals into the heat-generating resistance elements obtained according to this Example. For the electrical pulse signal, its duty was made 50%, applied voltage 20 V and the driving frequencies 0.5 KHz, 1.0 KHz and 2.0 KHz.

As a result, the heat-generating resistance elements were not destroyed even when the number of electrical pulse signal inputting reached 1×10$^{10}$ times in every case of driving at different driving frequencies, and their resistance values were substantially unchanged.

EXAMPLE 12

A heat-generating resistance layer with the same thickness was deposited in the same manner as in Example 11 except for changing the starting gases to CF$_4$/Ar=0.5 (volume ratio) and PF$_5$/Ar=1000 ppm (volume ratio).

Next, when heat-generating resistance elements were prepared and electrical pulse signal was inputted therein in the same manner as in Example 11, the heat-generating resistance elements were not destroyed even when the number of electrical pulse signal inputting reached 1×10$^{10}$ times. Also, no change in resistance value was recognized.

EXAMPLE 13

Heat-generating resistance elements were prepared by depositing a heat-generating resistance layer in the same manner as in Example 11 except for changing the substrate to #7059 glass (produced by Corning Glass Works).

When the thus obtained heat-generating resistance elements were driven in the same manner as Example 11, it was confirmed that they had satisfactory durability similarly as in Example 11.

EXAMPLE 14

Heat-generating resistance elements were prepared by depositing a heat-generating resistance layer in the same manner as in Example 12 except for changing the substrate to #7059 glass.

When the thus obtained heat-generating resistance elements were driven in the same manner as in Example 12, it was confirmed that they had satisfactory durability similarly as in Example 12.

TABLE 3

| Example No. | Starting material | Gas flow rate (SCCM) | Discharging power (W/cm$^2$) | Substrate temperature (°C.) | Film thickness (Å) |
|---|---|---|---|---|---|
| 11 | CF$_4$/Ar = 0.5 | 50 | 1.5 | 350 | 3000 |
|  | BF$_3$/Ar = 1000 ppm | 125 |  |  |  |
| 12 | CF$_4$/Ar = 0.5 | 50 | 1.5 | 350 | 3000 |
|  | PF$_5$/Ar = 1000 ppm | 125 |  |  |  |
| 13 | CF$_4$/Ar = 0.5 | 50 | 1.5 | 350 | 3000 |
|  | BF$_3$/Ar = 1000 ppm | 125 |  |  |  |
| 14 | CF$_4$/Ar = 0.5 | 50 | 1.5 | 350 | 3000 |
|  | PF$_5$/Ar = 1000 ppm | 125 |  |  |  |

EXAMPLE 15

Heat-generating resistance elements were prepared in the same manner as in Example 11 except for changing the flow rate of CF$_4$/Ar gas by changing continuously the degree of opening of the valve during formation of the heat-generating resistance layer. The conditions during deposition and the thickness of the heat-generating resistance layer are shown in Table 4.

Electric resistance of each heat-generating element thus obtained was measured to be 80 ohm.

Also, durability of each heat-generating resistance element was measured by inputting electrical pulse signals into the heat-generating resistance element obtained according to this Example. For the electrical pulse signal, its duty was made 50%, applied voltage 20 V and the driving frequencies 0.5 KHz, 1.0 KHz and 2.0 KHz.

As a result, the heat-generating resistance elements were not destroyed even when the number of electrical pulse signal inputting reached $1 \times 10^{10}$ times in every case of driving at different driving frequencies, and their resistance values were substantially unchanged.

EXAMPLE 16

A heat-generating resistance layer with the same thickness was deposited in the same manner as Example 15 except for changing the starting gases to $CF_4/Ar=0.5$ (volume ratio) and $PF_5/Ar=1000$ ppm (volume ratio).

Next, when heat-generating resistance elements were prepared and electrical pulse signal was inputted therein in the same manner as in Example 15, the heat-generating resistance elements were not destroyed even when the number of electrical pulse signal inputting reached $1 \times 10^{10}$ times. Also, no change in resistance value was recognized.

EXAMPLE 17

Heat-generating resistance elements were prepared by depositing a heat-generating resistance layer in the same manner as in Example 15 except for changing the substrate to #7059 glass and changing the flow rate of $CF_4/Ar$ gas.

When the thus obtained heat-generating resistance elements were driven in the same manner as in Example 15, it was confirmed that they had satisfactory durability similarly as in Example 15.

EXAMPLE 18

Heat-generating resistance elements were prepared by depositing a heat-generating resistance layer in the same manner as in Example 16 except for changing the substrate to #7059 glass and changing the flow rate of $CF_4/Ar$ gas.

When the thus obtained heat-generating resistance elements were driven in the same manner as in Example 16, it was confirmed that they had satisfactory durability similarly as in Example 16.

TABLE 4

| Example No. | Starting material | Gas flow rate (SCCM) | Discharging power (W/cm$^2$) | Substrate temperature (°C.) | Film thickness (Å) |
|---|---|---|---|---|---|
| 15 | $CF_4/Ar = 0.5$ $BF_3/Ar = 1000$ ppm | 50→70 125 | 1.5 | 350 | 3000 |
| 16 | $CF_4/Ar = 0.5$ $PF_5/Ar = 1000$ ppm | 50→70 125 | 1.5 | 350 | 3000 |
| 17 | $CF_4/Ar = 0.5$ $BF_3/Ar = 1000$ ppm | 50→30 125 | 1.5 | 350 | 3000 |
| 18 | $CF_4/Ar = 0.5$ $PF_5/Ar = 1000$ ppm | 50→30 125 | 1.5 | 350 | 3000 |

What is claimed is:

1. A heat-generating resistor having a functional thin film comprising an amorphous material containing halogen atoms in a matrix of carbon atoms formed on a substrate wherein the functional thin film further contains a substance for controlling electroconductivity which is distributed non-uniformly in the film thickness direction of the functional thin film.

2. A heat-generating resistance element comprising the heat-generating resistor of claim 1 and a pair of electrodes electrically connected to the heat-generating resistor.

3. A heat-generating resistor according to claim 1, wherein the halogen atom is F or Cl.

4. A heat-generating resistor having a functional thin film comprising an amorphous material containing halogen atoms in a matrix of carbon atoms formed on a substrate, wherein the substrate has a surface layer comprising an amorphous material having a matrix of carbon atoms on the side on which the functional thin film is formed.

5. A heat-generating resistor, having a functional thin film comprising an amorphous material containing halogen atoms in a matrix of carbon atoms formed on a substrate, wherein the halogen atoms are distributed nonuniformly in the film thickness direction of the functional thin film.

6. A heat-generating resistor according to claim 5, wherein the content of halogen atoms in the functional thin film is 0.0001 to 30 atomic %.

7. A heat-generating resistor according to claim 5, wherein the halogen atom is F or Cl.

8. A heat-generating resistor according to claim 5, wherein the substrate has a surface layer comprising an amorphous material having a matrix of carbon atoms on the side on which the functional thin film is formed.

9. A heat-generating resistor according to claim 5, wherein the functional thin film further contains a substance for controlling electroconductivity.

10. A heat-generating resistor according to claim 1, wherein the content of halogen atoms in the functional thin film is 0.0001 to 30 atomic %.

11. A heat-generating resistance element comprising the heat-generating resistor of claim 4 and a pair of electrodes electrically connected to the heat-generating resistor.

12. A heat-generating resistor according to claim 1, wherein the content of the substance for controlling electroconductivity is 0.01 to 50000 atomic ppm.

13. A heat-generating resistor according to claim 1, wherein the substance for controlling electroconductivity is an atom belonging to group III of the periodic table.

14. A heat-generating resistor according to claim 1, wherein the substance for controlling electroconductivity is an atom belonging to group V of the periodic table.

15. A heat-generating resistor according to claim 1, wherein the substrate has a surface layer comprising an amorphous material having a matrix of carbon atoms on the side on which the functional thin film is formed.

16. A heat-generating resistor according to claim 1, wherein halogen atoms are distributed nonuniformly in the film thickness direction of the functional thin film.

17. A heat-generating resistor according to claim 16, wherein the content of halogen atoms in the functional thin film is 0.0001 to 30 atomic %.

18. A heat-generating resistor according to claim 16, wherein the halogen atom is F or Cl.

19. A heat-generating resistor according to claim 16, wherein the content of the substance for controlling electroconductivity in the functional thin film is 0.01 to 50000 atomic ppm.

20. A heat-generating resistor according to claim 16, wherein the substance for controlling electroconductivity is an atom belonging to group III of the periodic table.

21. A heat-generating resistor according to claim 16, wherein the substance for controlling electroconductivity is an atom belonging to group V of the periodic table.

22. A heat-generating resistor according to claim 16, wherein the substrate has a surface layer comprising an amorphous material having a matrix of carbon atoms on the side on which the functional thin film is formed.

23. A heat-generating resistor according to claim 5, wherein the halogen atoms are distributed with greater content on the side of the substrate.

24. A heat-generating resistor according to claim 5, wherein the halogen atoms are distributed with smaller content on the side of the substrate.

25. A heat-generating resistor according to claim 5, wherein the halogen atoms are distributed with greater content in the central portion in the layer thickness direction.

26. A heat-generating resistor according to claim 23, wherein the distribution concentration of the halogen atoms is gradually decreased from the substrate side.

27. A heat-generating resistor according to claim 24, wherein the distribution concentration of the halogen atoms is gradually increased from the substrate side.

28. A heat-generating resistor according to claim 16, wherein the halogen atoms and/or the substance for controlling electroconductivity are distributed with greater content on the side of the substrate.

29. A heat-generating resistor according to claim 16, wherein the halogen atoms and/or the substance for controlling electroconductivity are distributed with smaller content on the side of the substrate.

30. A heat-generating resistor according to claim 16, wherein the halogen atoms and/or the substance for controlling electroconductivity are distributed with greater content in the central portion in the layer thickness direction.

31. A heat-generating resistor according to claim 28, wherein the distribution concentration of the halogen atoms and or the substance for controlling electroconductivity is gradually decreased from the substrate side.

32. A heat-generating resistor according to claim 29, wherein the distribution concentration of the halogen atoms and/or the substance for controlling electroconductivity is gradually increased from the substrate side.

33. A heat-generating resistor according to claim 16, wherein the distribution state of the halogen atoms is different from that of the substance for controlling electroconductivity.

34. A heat-generating resistance element comprising the heat-generating resistor of claim 5 and a pair of electrodes electrically connected to the heat-generating resistor.

35. A heat-generating resistance element comprising the heat-generating resistor of claim 16 and a pair of electrodes electrically connected to the heat-generating resistor.

* * * * *

UNITED STATES PATENT AND TRADEMARK OFFICE
CERTIFICATE OF CORRECTION

PATENT NO. : 4,870,388
DATED : September 26, 1989
INVENTOR(S) : MASAO SUGATA, ET AL.

It is certified that error appears in the above-identified patent and that said Letters Patent is hereby corrected as shown below:

ON TITLE PAGE:

IN [56] REFERENCES CITED

U.S. PATENT DOCUMENTS, "Tiedeman" should read --Tiedemann--.

COLUMN 3

Line 4, "so called" should read --so-called--.
    Line 21, "above described" should read --above-described--.

COLUMN 5

Line 17, "aimed" should read --desired--.
    Line 45, "aimed" should read --desired--.

COLUMN 8

Line 1, "1 $Kg/cm^2$ to" should read --1 $Kg/cm^2$, to--.
    Line 39, "deposition chamber 101" should read --deposition chamber 1101--.

COLUMN 9

Line 43, "s" should read --is--.

COLUMN 10

Line 39, "tho" should read --the--.

UNITED STATES PATENT AND TRADEMARK OFFICE
CERTIFICATE OF CORRECTION

PATENT NO. : 4,870,388
DATED : September 26, 1989
INVENTOR(S) : MASAO SUGATA, ET AL.

It is certified that error appears in the above-identified patent and that said Letters Patent is hereby corrected as shown below:

COLUMN 12

Line 65, "element" should read --elements--.

COLUMN 18

Line 22, "and or" should read --and/or--.

Signed and Sealed this

Twenty-eighth Day of April, 1992

Attest:

HARRY F. MANBECK, JR.

Attesting Officer　　　　Commissioner of Patents and Trademarks